United States Patent [19]

Stein et al.

[11] 4,456,506
[45] Jun. 26, 1984

[54] SUPERCONDUCTING CIRCUIT FABRICATION

[75] Inventors: Barry F. Stein, Dresher; Peter L. Young, North Wales, both of Pa.

[73] Assignee: Sperry Corporation, New York, N.Y.

[21] Appl. No.: 344,274

[22] Filed: Jan. 28, 1982

[51] Int. Cl.³ .................. C25D 7/12; C25D 11/02
[52] U.S. Cl. .................. 204/15; 204/35.1; 204/38 A
[58] Field of Search ............... 204/15, 38 A, 38 N

[56] References Cited

U.S. PATENT DOCUMENTS

| | | | |
|---|---|---|---|
| 3,634,203 | 1/1972 | McMahon | 204/15 |
| 3,862,017 | 1/1975 | Tsunemitsu | 204/15 |
| 3,971,710 | 7/1976 | Romankun | 204/15 |
| 4,108,738 | 8/1978 | Cho | 204/15 |
| 4,146,440 | 3/1979 | Thompson | 204/15 |

Primary Examiner—Thomas Tufariello
Attorney, Agent, or Firm—John B. Sowell; Thomas J. Scott; Marshall M. Truex

[57] ABSTRACT

An improved method of anodization of thin films for the fabrication of superconducting devices. An electrically conducting contact layer is formed over a substrate between an electrically conducting object layer and the substrate. Also, an electrically insulating layer is formed between the object layer and the contact layer. The contact layer is connected to a power supply and at least a preselected portion of the object layer is anodized to a predetermined thickness. This may include anodizing all of some preselected portions through the complete thickness of the object layer. A pattern of hardened photoresist on the object layer provides portions not protected by the pattern. When anodization of the electrically conducting object layer takes place, the resulting anodized portion is thicker than the thickness of the portion of the object layer that it replaces. The present invention further includes reducing the preselected portion of the object layer to be anodized by a predetermined amount before anodizing so that when anodization is complete, the resulting partially anodized partially conducting object layer is substantially planar. Alternatively, the thickness of the anodized preselected portions can be reduced after anodizing by a predetermined amount to cause the layer to be substantially planar. The same pattern of hardened photoresist can be used when reducing the thickness of portions of the object layer or anodized preselected portions.

13 Claims, 8 Drawing Figures

SUPERCONDUCTING CIRCUIT FABRICATION

This invention relates to an improved method of fabricating multilayered superconducting circuits and to the circuits produced thereby.

BACKGROUND OF THE INVENTION

Multilayered superconducting circuits are fabricated using a variety of fabrication steps including vacuum deposition, photolithography, etching and more. In vacuum deposition, a host material, a portion of which is to be deposited in a thin film on a substantially planar substrate material, is caused to emit or provide a stream or flux of atoms of the host material. (In sputtering, for example, atoms from the surface of the host material are ejected by bombarding the host material with energetic particles). The flux of atoms emitted from the host material and arriving at the substrate arrives with an angular distribution.

In some of the layers of deposited thin film it is desirable to form a pattern by removing the material of the thin film in some regions and leaving the thin film in place in other regions. To accomplish this, a photoresist material is uniformly distributed over the surface of the thin film. A mask containing the pattern to be transferred to the thin film is placed above the thin film. Light is shown through the mask which light dissociates the photoresist wherever it impinges on the photoresist. The photoresist not developed by the light is washed away in a special bath but the unexposed photoresist remains. Then the surface of the thin film is etched and that portion of the thin film not protected by the unexposed photoresist is removed. Following this the unexposed photoresist is removed in a special bath leaving behind the pattern of the mask in the thin film. This process of transferring the pattern to the thin film is called photolithography. The pattern comprises plateaus of material from the top thin film and lower areas of previously deposited thin film layers or the substrate itself which lower areas are exposed by the process of photolithography. The difference between a lower area and a plateau is called a step. Note the process described above uses a commercially available positive photoresist such as the Shipley AZ 1350J. A similar process can be used with a negative photoresist such as the Kodak 809.

A problem arises when it is necessary to deposit new thin film layers over the recently patterned thin film, or more particularly, over the steps. Because the atoms of the host material forming the thin film arrive at the substrate with an angular distribution and because the steps have substantially vertical walls, the plateaus act to shadow the lower areas and prevent the atoms forming the new thin film from growing at the same rate in the lower areas as on the plateaus. As more and more material is deposited over the steps, a crack may develop in the thin film layers over the steps, as the films grow together. This destroys the usefulness of the device.

The present invention overcomes the problem of cracking when covering steps with layers of thin films by providing for the fabrication of patterned planer layers over the substrate, formed in part by anodizing portions of thin metallic films including anodizing all of preselected portions of the metallic film completely through the thickness of the film to the underlying thin film when necessary. This in part eliminates the steps.

In the process of liquid anodization, a metallic member to be anodized is connected to the positive terminal of a power supply and the metallic member is immersed in an electrolytic solution. The negative terminal of the power supply is connected to a cathode which is also immersed in the electrolyte. In another form of anodization, plasma anodization, an oxide film is grown on a metallic member by applying an electric field between the metallic member and the oxygen plasma in which it is immersed. As long as current flows from the cathode through the electrolyte (or oxygen plasma) and then through the metallic member to the positive terminal, oxidation of the metallic member occurs. However, with prior art anodization (both liquid and plasma) it has been difficult to fully anodize all portions of the metallic member which are to be anodized due to nonuniformity in the thickness of the films. Internal metallic regions of the metallic member become electrically isolated due to the formation of surrounding, insulating areas of anodized metallic material. Once these internal regions become electrically isolated from the positive terminal, it is no longer possible to anodize them. Therefore, the article may contain unwanted, unanodized, interior metallic regions, which detract from the usefulness of the anodized metallic member for its intended purpose. Also, the presence of unanodized metallic regions reduces the effectiveness of the anodized material as an electrical insulation medium. The present invention overcomes this problem with an improved method of anodization.

The problem discussed above with respect to anodization is described in Romankiw, U.S. Pat. No. 3,971,710. See column 1, lines 18–44. Romankiw discloses an anodizing process which includes depositing a first conductive layer on a dielectric layer and then depositing a porous metal oxide-forming layer on the first conducting layer. Then the porous metal oxide-forming layer is completely anodized and the first conductive layer is treated to render it non-conductive. However, Romankiw also discloses that when attempting to render the first conducting layer entirely non-conductive after anodizing the porous metal oxide-forming layer so that both the first conductive layer and the porous metal oxide-forming layer are rendered non-conductive through the complete thickness to the dielectric substrate, the electrically conductive layer may still conduct electricity up to a very small degree, "such as when the bulk of the underlayer (electrically conductive layer) is rendered nonconductive with small amounts of untreated metal residue hydroxides or hydrated oxides remaining". See Col. 7, lines 34 through 42. Hence, Romankiw discloses a method of completely anodizing a porous oxide-forming conductive layer using a first conductive layer in contact therewith, but does not disclose how to eliminate the aforementioned prior art problem in anodization when attempting to render both the porous metal oxide-forming metal layer and the first conductive layer completely nonconductive through the complete thickness of both layers to the underlying substrate.

SUMMARY OF THE INVENTION

The present invention relates to an improved method of anodization of thin films, to the fabrication of planar surfaces and to the fabrication of superconducting devices using the improved method. An electrically conducting contact layer is formed over a substrate between an electrically conducting object layer and the substrate. Also, an electrically insulating layer is formed between the object layer and the contact layer. The contact layer is connected to a power supply and at least a preselected portion of the object layer is anodized to a predetermined thickness. This may include anodizing all of some preselected portions through the complete thickness of the object layer.

When anodization of the electrically conducting object layer takes place, the resulting anodized portion is thicker than the thickness of the portion of the object layer that it replaces. The present invention further includes reducing the preselected portion of the object layer to be anodized by a predetermined amount before anodizing so that when anodization is complete, the resulting partially anodized partially conducting object layer is substantially planar. Alternatively, the thickness of the anodized preselected portions can be reduced after anodizing by a predetermined amount to cause the partially anodized, partially conducting layer to be substantially planar.

Improved superconducting devices can be made using the above improved anodization process. For example, the present invention comprises a superconducting circuit having an electrically conducting substantially planar contact layer formed over a substrate. Subsequently, a substantially planar, patterned conducting layer is formed (from a uniform conducting layer) over the contact layer, the conducting portions being insulated from the contact layer. In the preferred embodiment, the patterned conducting layer comprises at least a ground plane conductor portion. Finally, a Josephson Junction tunneling device having a base electrode layer is formed over the substantially planar patterned conducting layer. In the preferred embodiment, the insulation of the ground plane from the contact layer is formed by anodizing the conducting layer.

In an alternate embodiment, the superconducting circuit comprises a substantially planar electrically conducting base electrode portion of the Josephson Junction tunneling device formed from a second uniform conducting layer and formed substantially parallel and spaced apart from the ground plane portion and electrically insulated therefrom. In the preferred embodiment, insulation between the conducting base electrode portion and the ground plane portion comprises anodized portions of the first conducting layer.

Objects, features and advantages of the present invention will become more fully apparent from the following detailed description of the preferred embodiment, the appended claims and the accompanying drawings in which:

BRIEF DESCRIPTION OF THE DRAWINGS

FIGS. 3a through 3g show a preferred embodiment method of the present invention while

DETAILED DESCRIPTION OF THE INVENTION

Figure 1:
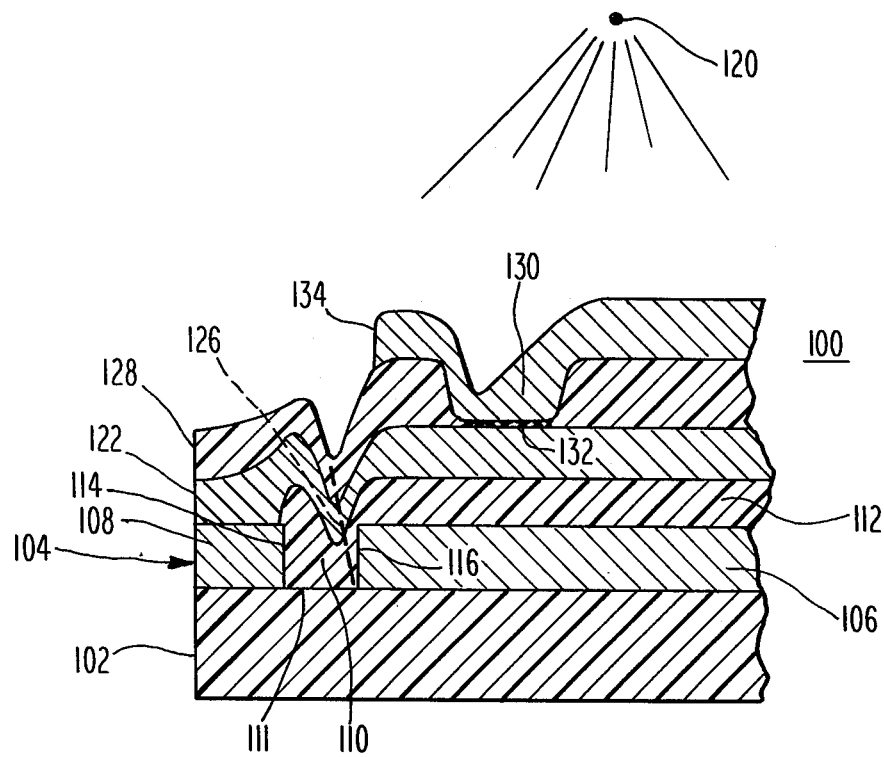
FIG. 1 is an elevational cross sectional view of a prior art multilayered integrated circuit.

Referring now to FIG. 1, a prior art multilayered integrated circuit designated generally 100 as shown in cross section. It comprises a dielectric substrate 102 on which is deposited a thin layer of electrically conducting material designated generally 104. The layer 104 is deposited to a predetermined thickness using vacuum deposition techniques such as RF sputtering. The conducting layer 104 is then patterned using conventional photoresist and etching techniques to form at least one ground plane region 106 and one or more connector pad portions 108. The ground plane portion 106 and the connector pad portion 108 are electrically insulated from one another on the dielectric substrate 102 by the separation in the region 110.

The separation region 110 is formed by a portion 111 of the top surface of the dielectric substrate 102 and by the substantially vertical, parallel and spaced apart walls 114 and 116. The top of layer 104 forms a plateau above the lower area of the portion 111 of dielectric substrate 102. The distance between the lower area and the plateau is called a step. In FIG. 1 the region 110 bounded by the substantially vertical walls 114 and 116 can be formed by any anisotrophic etching process such as ion beam milling.

In order to insulate the ground plane portion 106 from subsequently formed electrically conducting layers, an insulating layer 112 is deposited over the ground plane region 106 and in the separation region 110. (again using vacuum deposition such as sputtering). Note that the layer 112 is not substantially planar in all regions as it covers the step and fills in the space in region 110. Instead it becomes warped and more material is deposited against wall 114 than against the parallel and spaced apart wall 116. This is so because in general the atoms forming the new layer are emitted from a host source located in a single location in space such as the location 120 in FIG. 1. Wall 114 is more fully exposed to the flux of atoms from location 120 than wall 116.

Following layer 112, a second electrically conducting layer 122 is deposited over the insulating layer 112 and over connector pad portion 108 making electrically conductive contact therewith. Once again the layer 122 is not substantially planar in the area over the step. The layer 122 follows the contour set by layer 112 in the vicinity of the step.

The circuit 100 is completed by masking the region 130 with unexposed photoresistant and by depositing an insulating thin film layer 128 over the remaining portions of layer 122. Again, layer 128 follows the contour set by layers 112 and 122 in the vicinity of step. In the region 130 a tunnel barrier 132, shown cross-hatched in FIG. 1, is formed by forming an oxide of the electrically conducting layer 122. Once the tunnel barrier 132 is formed, a third electrically conducting layer 134 is deposited over the insulating layer 128 including the tunnel barrier region 130 over the tunnel barrier 132.

In the prior art embodiment 100, layer 122 is called a base electrode and is formed from a superconducting material such as niobium or lead or an alloy thereof. Insulating layer 128 is SiO, and layer 134 is called a counter electrode which is also formed from a superconducting material such as niobium, lead or an alloy thereof. The details of film deposition, patterning and the details of fabrication of the tunnel barrier between the base and counter electrodes is known and has been published. See for example, "Niobium, Oxide-Barrier Tunnel Junction", IEEE Transaction on Electron Devices, Vol. ED27, No. 10, Oct. 1980, hereby incorporated by reference as if specifically set forth herein. See also, "Ion Etching For Pattern Delineation", Journal of Vacuum Science Technology, Vol. 13, No. 5, Sept./Oct. 1976, and "Fabrication Process For Josephson Integrated Circuits", IBM Journal, Vol. 24, No. 2, March, 1980.

The ground plane region 116 is disposed below the junction 132. It aids in shielding the junction from external electromagnetic fields occurring below the circuit 100. An external electrical contact must be made to the base electrode 122. Lead alloys used in making base electrodes are easily scratched when making electrical contact thereto. This can result in holes being created through the base electrode 122 possibly resulting in poor electrical contacts. Hence, when using lead alloy base electrodes, connector pads made from an electrically conducting metal other than lead or lead alloys, such as niobium, are formed to make electrical contact with the lead alloy base electrode. If a hole should form in the base electrode, electrical contact with an external lead is assured by the presence of the connector pad.

Providing continuous thin film coverage over steps etched in previous thin film layers in a multilayered device, particularly, where there are more than one layer covering the steps, is a well-known problem existing in the fabrication of multilayered integrated circuits. The problem is that cracks may develop along the dotted line 126 in FIG. 1 as the different layers grow together. These cracks cause the devices to be inoperative or to operate intermittently. Hence, the reliability of multilayered integrated devices is affected. These step coverage problems occur because the basic steps in fabricating a multilayered integrated structure include etching a pattern into an electrically conducting thin film layer to form the step. Thereafter, insulation is provided by depositing an insulating layer over the patterned electrical conducting layer including the step. In the present invention, using an improved method of anodization, patterning of the electrically conducting layer is accomplished at least in part by anodizing through the complete thickness of the layer in those areas defined by the desired pattern. When an insulating layer is then laid down on the patterned electrically conducting layer it is substantially planar there being no steps to fill.

Figure 4:
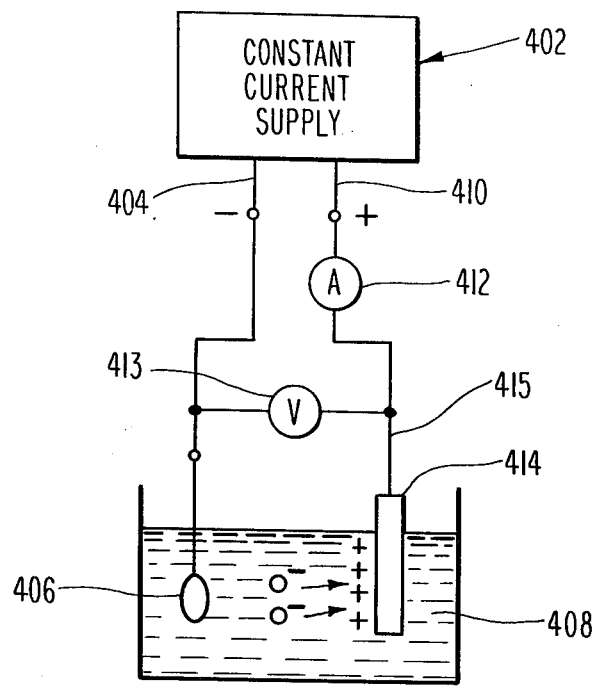
FIG. 4 is a block diagram of an arrangement used for anodizing an element.

FIG. 4 represents a block diagram of an apparatus for carrying out anodization. A constant current power supply designated generally 402 has its negative terminal 404 connected to a cathode 406 immersed in a suitable electrolytic solution 408. The positive terminal 410 of the power supply 402 is connected through an ammeter 412 to the metallic element 414 to be anodized. The power supply generates a voltage V as measured by voltmeter 413 between the cathode and anode. The metallic element 414 is also immersed in the electrolytic solution 408. As current flows from the cathode 406 through the electrolyte 408 to the metallic element 414, negative oxygen ions move along the electric force fields set up between the cathode and the metallic element to the metallic element 414 where they react with the element to oxidize it and form a metallic oxide. For best results with anodization, the metallic element comprises a valve metal which has the characteristic that it will anodize only to a specific thickness which is primarily dependent on the magnitude of the potential V applied in the process and the specific material of the metallic element itself. To anodize the metallic element to a greater thickness, V must be increased. (For details on plasma anodization, see "Plasma Anodization of Metals and Semiconductors", The Journal of Vacuum Science and Technology, Vol. 7, No. 2, 1969)

Figure 2A:
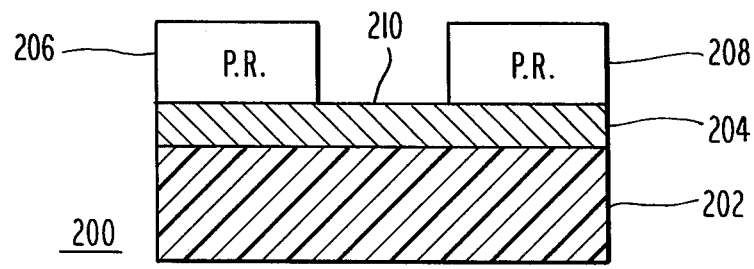
FIGS. 2a and 2b show two steps in the process of anodization in the prior art.

Referring now to FIG. 2(a), an article designated generally 200 to be anodized using the above described prior art electrolytic anodization method comprises a dielectric substrate 202 and a thin electrically conducting layer 204 deposited on the substrate 202. A uniform layer of photoresist is applied to the layer 204. Then the photoresist is developed according to the pattern of a mask in conventional manner. The exposed photoresist is washed away leaving unexposed photoresist 206 and 208. The surface portion 210 of the layer 204 is left unprotected.

Figure 2B:
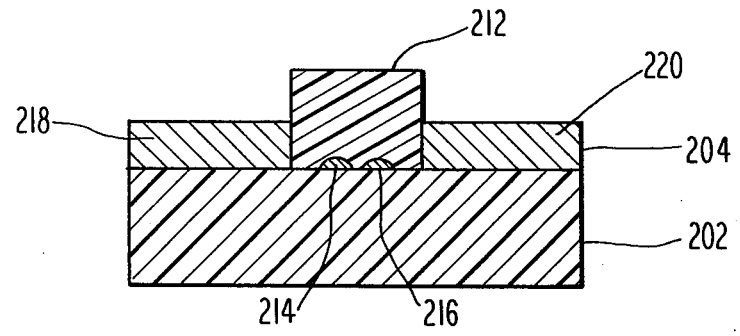
Figure 5A:
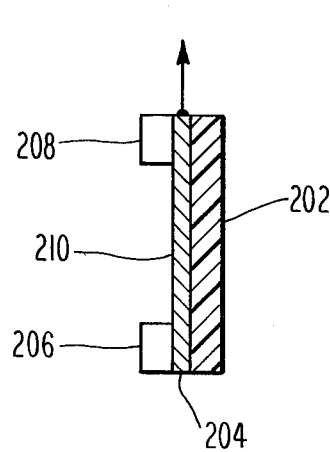
FIGS. 5(a) and 5(b) are enlarged schematics of a portion of FIG. 4 showing alternate embodiments of the element undergoing anodization.

The article 200 of FIG. 2(a) is immersed in the electrolytic solution 408 of FIG. 4 and the positive terminal 410 of the power supply 402 is connected to the metallic layer 204 of article 200 via line 415. See FIG. 5a. A problem exists with the prior art method of anodization when it is used in an attempt to anodize all of the exposed portion of the layer 204 through the complete thickness thereof to the dielectric layer 202. Refer now to FIG. 2(b). As anodization of some portions of the metallic region to be anodized are completed to the dielectric surface 202, some isolated remaining metallic regions 214 and 216 of layer 204 will become surrounded by anodized material insulating the inside metallic regions from the positive terminal of the power supply 402. No voltage difference can be applied to the isolated metallic regions 214 and 216 from the external circuit. Hence, anodization ceases and the residual electrical conducting metallic regions 214 and 216 are left behind in the separation between the electrically conducting layer portions 218 and 220 which were not anodized because of the photoresist portions 206 and 208. (In FIG. 2(b), portions 206 and 208 have been removed after anodization.) These interior metallic regions 214 and 216 leave the electrical resistance of the anodized region 212 between conducting portions 218 and 220 at an unacceptable level for some applications in multilayered integrated devices such as superconducting circuits. Note also, that the anodized portion 212 has a thickness which is greater than the thickness of the metallic layer which it replaces.

Figure 3G:
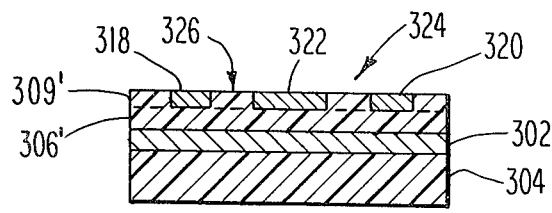
Figure 3F:
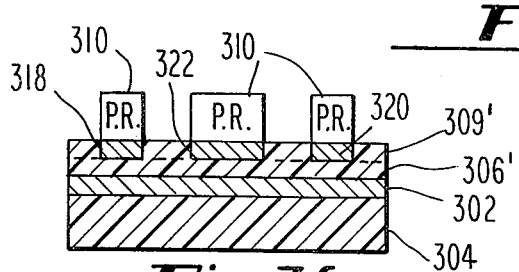
Figure 3I:
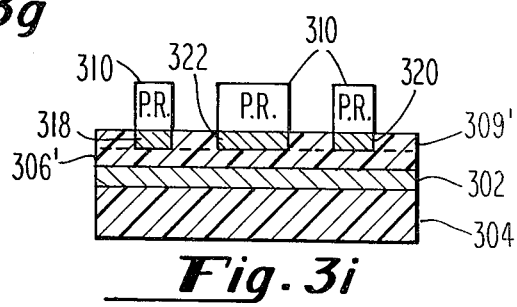
FIGS. 3(h) and 3(i) show an alternate embodiment replacing the steps shown in FIGS. 3(e) and 3(f).
Figure 3E:
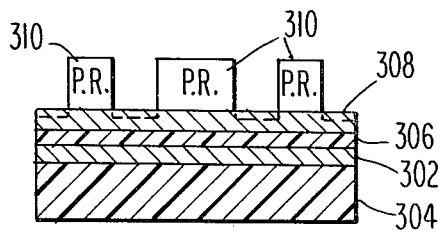
Figure 5B:
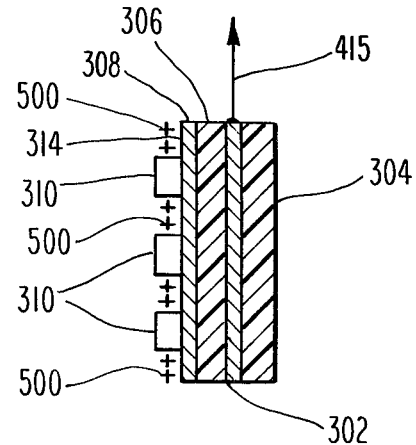

A brief description of an improved method of anodization which overcomes the prior art problem of anodization described above follows with details of the steps being subsequently described. Referring now to FIGS. 3a–3d, an electrically conducting contact layer 302 is formed over a substrate 304. as shown in FIG. 3a. Next an electrically insulated layer 306 is formed on contact layer 302 (FIG. 3b) and an electrically conducting object layer 308 is formed over the insulating layer 306 (FIG. 3c). Since the object layer 308 is the layer to be patterned, a pattern of photoresist 310 (FIG. 3d) is formed on the surface of layer 308 in the conventional manner of photolithography. When these steps are finished an article such as the article designated generally 312 in FIG. 3d has been formed and is used as the anode 414 immersed in electrolyte 408 in FIG. 4. However, it is the contact layer 302 which is connected to line 415 and not the layer 308 to be anodized. See FIG. 5b.

Anodization of the object layer 308 takes place because of the presence of a positive charge layer 500 at the surface of the metallic film 308 which is in contact with the surrounding electrolyte 408. The magnitude of this charge layer is given approximately by $$Q/A = \epsilon V/4\pi d$$

where A is the surface area of the layer 308 and d is the thickness of the insulating layer 306. The negative oxygen ions in the electrolyte 408 are attracted to the positive charge per unit area, Q/A, and anodization of layer 308 takes place in those areas exposed to the solution and not protected by photoresist 310. As long as the contact layer 302 is connected to line 415 the electrically conducting layer 308 will experience a charge per unit area of Q/A and negative oxygen ions will be attracted thereto and anodization will take place. Hence, all of the layer 308 in the exposed areas not protected by photoresist 310 will anodize completely through the thickness of layer 308 to the underlying layer 306. Remember this is not true in the prior art where a layer being anodized is connected to line 415 and as interior metallic regions become isolated electric field lines do not pass therethrough to attract the negative oxygen ions for anodization.

Figure 3H:
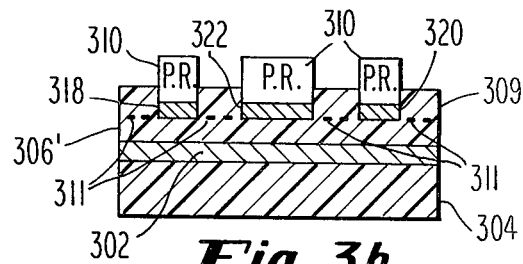
Figure 3D:
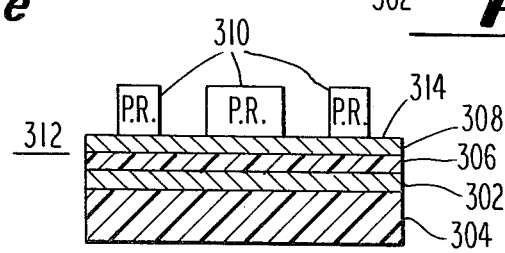
Figure 3C:
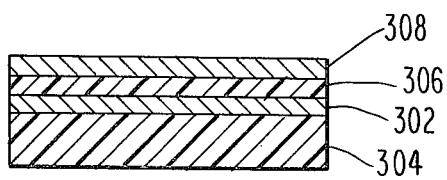
Figure 3B:
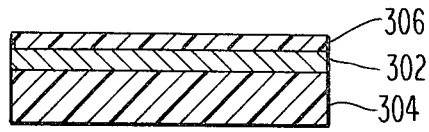
Figure 3A:
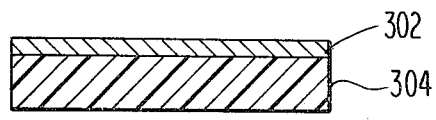

When the unprotected portion of layer 308 in FIG. 3d is anodized, the anodized portion 309 of FIG. 3h is the result. Note that all that remains of layer 308 from FIG. 3d are connector pad conducting portions 318 and 320 and a ground plane conducting portion 322. Anodized portion 309 is contiguous to the insulating layer 306 (FIG. 3d) shown as 306' in FIG. 3h along the dotted lines 311. Note that the thickness of the anodized portion 309 is greater than the thickness of the remaining portions of layer 308, namely portions 318, 320 and 322 in FIG. 3h. The next step is to remove by, for example, ion beam milling an excess portion of the anodized portion 309 (FIG. 3h) which is above the electrical connector pad and ground plane portions 318, 320 and 322, respectively. See layer 309' in FIG. 3(i). When removing the excess anodized portion, the same pattern of photoresist 310 which was present during the anodization step of FIG. 3h is used to protect the remaining electrically conducting portions 318, 320 and 322 in step 3(i). After the excess anodized portion is removed, the photoresist material 310 is removed so that the end product illustrated in FIG. 3g, has a substantially planar top surface.

Alternatively, for a given electrically conducting material comprising layer 308, the increase in thickness brought about by anodizing the material of layer 308 is predictable. Before anodizing the exposed portions of layer 308 in FIG. 3d, a predetermined amount of the layer 308 in the exposed area can be removed as illustrated by the dotted lines in FIG. 3e by, for example, ion beam milling before the remainder is anodized. Note in FIG. 3e that a portion of the thickness of the layer 308 is removed from the exposed surface areas of layer 308 before anodization. Now when the exposed remaining layer is anodized by the process previously described, the thickness of the resultant anodized portion 309' equals the thickness of the remaining electrically conducting connector pad and ground plane portions 318, 320 and 322 respectively, as shown in FIG. 3f. Again when removing a portion of the electrically conducting layer 308 in the exposed area the pattern of photoresist 310 is used to protect the portions of the layer 308 which are not to be anodized, portions 318, 320 and 322. Note that the circuit of FIG. 3f is similar in structure to the structure of FIG. 3i.

When the photoresist pattern 310 is removed from the article 312 after either step 3f or 3i, the resultant multilayer structure designated generally 324 in FIG. 3g has a planar patterned electrically conducting layer comprising portions 318, 320 and 322. Note there are no steps in the structure between the conducting portions 318 and 320 or 320 or 322. A substantially planar thin film layer of insulating material can now be deposited on the partially anodized, partially conducting surface designated generally 326 of the structure 324.

The above improved method of anodization can be applied to electrically conducting object layers made of the valve metals, that is, the metals that can be anodized such as group IIA metals such as magnesium; group IVA material such as tin; amorphous silicon and polycrystalline silicons; group IVB substances such as titanium, zirconium and hafnium; group VB metals, such as vanadium, niobium and tantalum; and group VIB metals such as tungsten, chromium, and molybdenum. Also, aluminum and aluminum alloys can be used. The contact layer can be any electrically conducting material. In the preferred embodiment, however, the present invention comprises a superconducting circuit where the electrically conducting object layer such as layer 308 is a superconducting material such as niobium. Superconducting materials which have superconducting characteristics above at least 4.2 degrees Kelvin and which are amenble to anodization are acceptable. Niobium/aluminum alloys and niobium nitrate are probably also suitable.

In the preferred embodiment, a two thousand angstrom thick niobium layer 302 is RF sputtered on a SiO substrate 304 in a $3 \times 10^{-3}$ torr atmosphere. The RF voltage is 2000 volts. The sputtering rate is about 400 Angstroms per minute. When using the contact layer as an anode, the layer 302 is anodized to form a 1500 Angstrom thick film of $Nb_2O_5$. This comprises a layer 306. (A preferred anodizing electrolyte comprises 156 grams of ammonium pentaborate in 1120 milliliters of ethylene glycol and 760 milliliters water.) Next, a one thousand Angstrom thick layer 308 of niobium is formed by e beam evaporation or magnetron sputtering. The photoresist used for patterning of the layer 308 is AZ 1350J made by Shipley Co., Newton, Mass. The pattern 310 is formed in the usual way using photolithography.

In the preferred embodiment, step 3e comprises ion milling the area above the dotted lines in FIG. 3e with 800 volt argon ions in $3 \times 10^{-4}$ torr argon atmosphere. The niobium is etched away at a rate of 210 Angstroms per minute. Although ion beam milling is used in the preferred embodiment, any anisotropic etching technique is acceptable. Etching takes place for three minutes removing 630 Angstroms and leaving 370 Angstroms of niobium in the exposed areas to be anodized. The 370 Angstroms of niobium are then anodized to form a 1000 Angstrom thick layer of $Nb_2O_5$ equal in thickness to the niobium conducting portions 318, 320 and 322. When anodization of the 370 Angstrom thickness is complete, the current I as measured by the ammeter 412 will decrease rapidly. The structure of FIG. 3f is then immersed in acetone to remove the photoresist. Note that in the preferred embodiment in FIG. 3d the contact layer is niobium and the insulating layer 306 is $Nb_2O_5$. Hence when portions of layer 308 are anodized through the entire thickness to layer 306, a uniform insulation region of $Nb_2O_5$ is formed around the conducting portions 318, 320 and 322. See 306' and 309' in FIG. 3g. However, it is not necessary that contact layer 302 be niobium nor that layer 306 be an anodized material formed from the contact layer. For example, the contact layer can be any electrically conducting material and any insulation material can be formed that will provide good adhesion to layer 308 when formed and to the anodized portions of 308 when formed. Such an insulation material might be SiO or $Ta_2O_5$.

Alternatively, the layer 308 in FIG. 3d can be anodized directly to form the anodization layer 309 in FIG. 3h. Then the exposed top surface of layer 309 not protected by the photoresist 310 can be reduced by ion milling with 800 volt argon ions in a $3 \times 10^{-4}$ torr argon atmosphere. Etching is done at a rate of 427 Angstroms per minute for four minutes. Then the structure is immersed in acetone to remove the photoresist 310 resulting in the multilayered circuit 324 in FIG. 3g.

Figure 6A:
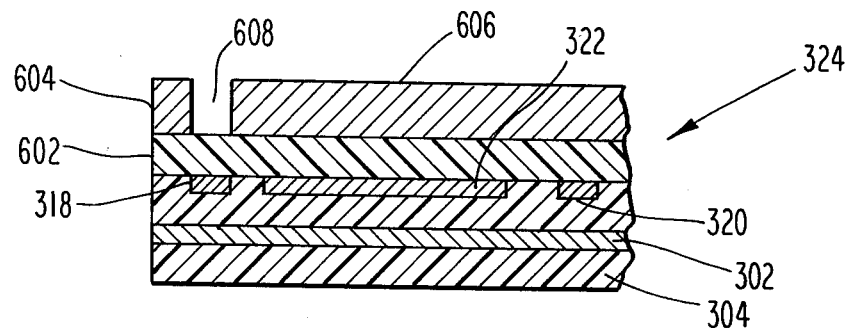
FIGS. 6(a) through 6(c) are a series of cross-sectional elevational views of a preferred embodiment superconducting circuit of the present invention during various stages of fabrication.
Figure 6B:
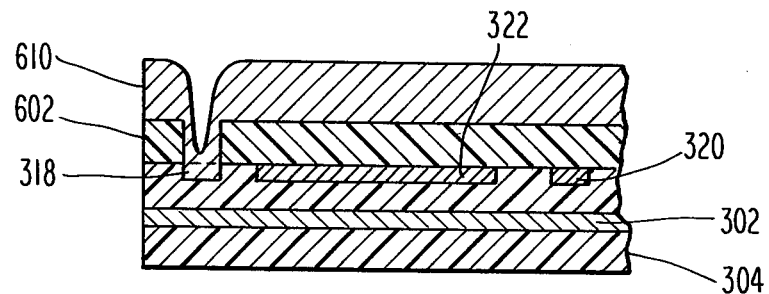
Figure 6C:
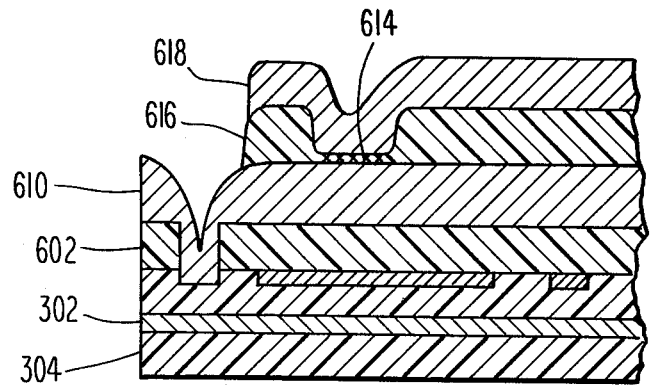

FIGS. 6a through 6c show a multilayered superconducting circuit in three stages of fabrication. In FIG. 6a, the planarized structure 324 provides the starting point. An insulating layer 602 such as SiO is deposited on the planarized structure 324 of FIG. 3(g) over the conducting portions 318, 320 and 322. Next a photoresist pattern 604 and 606 is formed on the insulating layer 602. The pattern comprises a space 608 separating the portions 604 and 606.

In FIG. 6b, the SiO layer 602 has been etched in the portion of the layer below the space 608, that is, the area not protected by the photoresist pattern. The etching has occurred through the entire thickness of the layer 602 to the conducting pad portion 318 which was exposed to the open atmosphere as a result of the etching step. FIG. 6b further shows electrically conducting layer 610 deposited on layer 602 and partially filling the step formed by the etching step in layer 602. The electrically conducting material from layer 610 makes electrical contact with the connecting portion 318. The electrically conducting layer 610 is no longer substantially planar in the region covering the step for reasons described earlier.

The electrically conducting layer 610 forms the base electrode portion of the superconducting device. In FIGS. 6b and 6c layer 610 is a lead alloy. Therefore, it is shown making electrical contact with the connector pad portion 318 and having a portion disposed above the ground plane portion 322 for the reasons given earlier. Even though layer 610 is not a substantially planar layer throughout its entire extent it is formed over a connector pad and ground plane region comprising conducting portions 318, 320 and 322 which itself is planar. This eliminates forming the base electrode over several layers formed over a step which step starts at the connector pad and ground plane level. This reduces the likelihood and severity of cracking of the layers formed over steps in multilayered structures. Once the base electrode is formed, the tunnel barrier junction 614 in FIG. 6c, the insulating layer 616 and counter electrode 618 are formed in a conventional manner to complete the Josephson Junction.

Figure 7A:
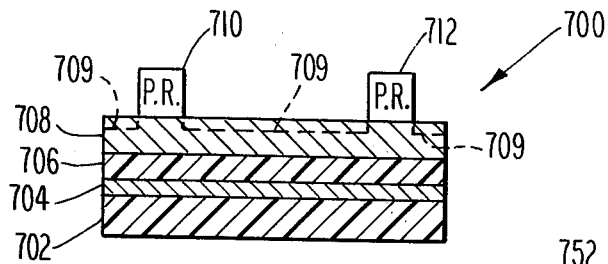
FIGS. 7(a) through 7(g) are a series of cross-sectional elevational views of a first alternate embodiment superconducting circuit of the present invention during various stages of fabrication.

FIGS. 7a through 7g show a multilayered superconducting circuit in seven stages of fabrication. In FIG. 7a, a structure designated generally 700 similar to that of FIG. 3c is used as a starting point, the structure comprising substrate layer 702 made of $SiO_2$ electrically conducting contact layer 704 made of niobium, electrically insulating layer 706 formed by partially anodizing layer 704, and an electrically conducting object layer 708 made of niobium. In the preferred embodiment, layer 708 is 2000 Angstroms thick. In FIG. 7a, a first pattern of photoresist comprising portions 710 and 712 is formed on object layer 708. The remaining exposed surface of layer 708 not protected by the photoresist portions 710 and 712 is first etched to a thickness of layer 708 shown by the dotted lines 709 in FIG. 7a. Then the exposed surfaces are anodized to form the substantially planar, partially anodized and partially conducting layer designated generally 720 in FIG. 7b. Alternatively, the exposed surfaces of layer 708 could first be anodized and then etched to form a substantially planar surface.

Figure 7E:
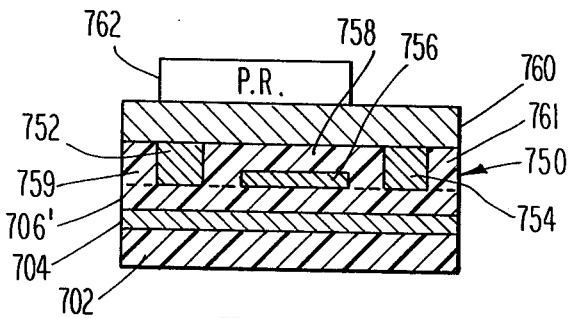
Figure 7B:
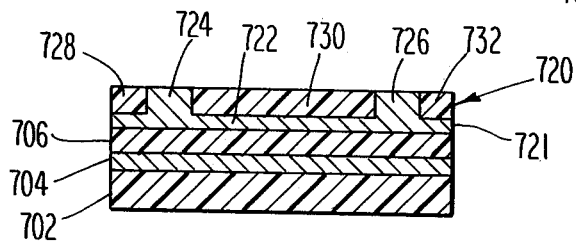

Layer 720 of FIG. 7(b) comprises an electrically conducting portion 721 including a planar portion 722 and two upright extension portions 724 and 726 connected to the planar portion 722. Insulating material formed by anodizing object layer 708 in FIG. 7a is formed on top of the planar conducting portion 722 in regions 728, 730 and 732. Region 730 separates upright conducting portion 724 and 726 from one another. The photoresist portions 710 and 712 of FIG. 7(a) are removed by dipping the structure in acetone.

Figure 7F:
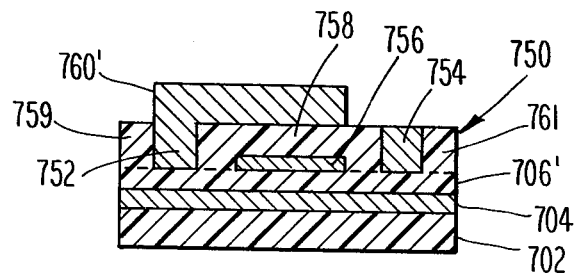
Figure 7C:
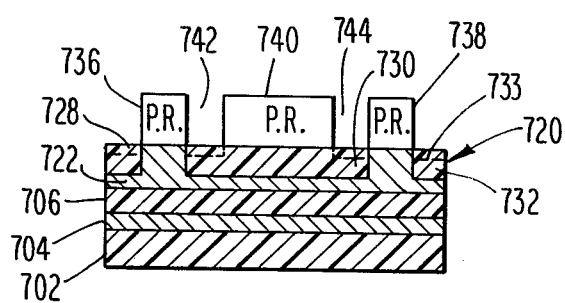

In FIG. 7(c), a new photoresist pattern is formed on composite layer 720, the photoresist pattern comprising portions 736 and 738 which are identical in size and location to photoresist portions 710 and 712 in FIG. 7a. Photoresist portions 736 and 738 are positioned over the top surface of upright extension portions 724 and 726. The width of portions 736 and 738 may exceed the width of portions 724 and 726 for ease of alignment. In addition, the photoresist pattern of FIG. 7c comprises a center portion 740 located between portions 736 and 738 and separated therefrom by gaps 742 and 744.

Figure 7D:
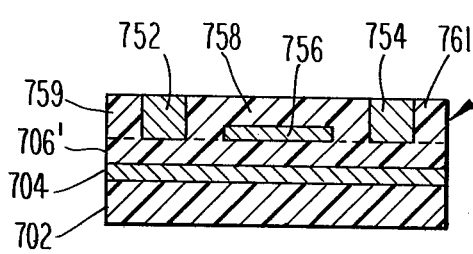

Using the contact layer 704 as an anode, portions of the planar conducting portion 722 of FIG. 7c in composite layer 720 are anodized completely through the thickness of the planar portion 722 to the anodized insulating layer 706 of FIG. 7c designated 706' in FIG. 7d. The portions of planar portion 722 located below the photoresist pattern 736, 738 and 740 are not anodized at this time. This results in a new composite layer designated generally 750 in FIG. 7d. In one embodiment a portion of the anodized portions 728, 730 and 732 is etched away to the dotted line 733 in FIG. 7c before anodizing. The resultant layer 750 is then planar. Alternatively, the anodized portions 728, 730 and 732 can be etched, after anodization through the layer 722 is complete, to form a substantially planar layer 750. The composite layer 750 comprises two upright electrical conducting portions 752 and 754. Conductor portions 752 and 754 include the conductor portions 724 and 726 of FIG. 7b and portions of the conducting planer portions 722 located below portions 724 and 726. Portions 752 and 754 extend from the insulating layer 706' in FIG. 7d through the thickness of the composite layer 750.

Composite layer 750 further comprises a ground plane portion 756 in contact with insulating layer 706' but otherwise surrounded by anodized material in the region 758 formed by anodizing the conducting layer 708 of FIG. 7a and then by anodizing portions of planar conducting portion 722 of FIG. 7b as described above. Ground plane portion 756 is effectively electrically isolated from upright portions 752 and 754 by region 758. Note that because of the contact layer used as an anode, anodizing through the entire thickness of the planar conducting portions 722 in the regions not protected by photoresist in FIG. 7(c) is complete. Because of the presence of the photoresist center portion 740 no negative oxygen ions penetrated directly through to the planar layer 722 in FIG. 7b in this area to anodize it in the portion now labelled ground plane portion 756 in FIG. 7c.

Figure 7G:
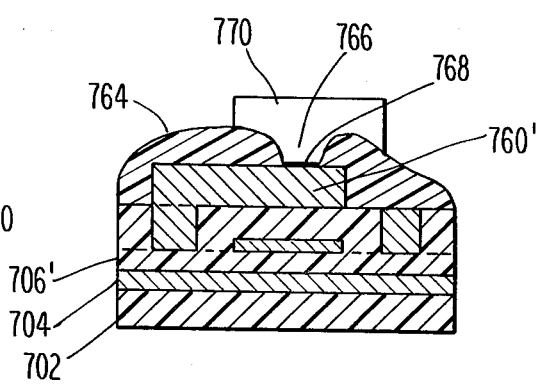

The composite layer 750 forms a substantially planar partially anodized and partially conducting layer on which an electrically conducting layer 760 is deposited in FIG. 7(e). In FIGS. 7e through 7g, layer 760 is a superconducting material made from a lead alloy. A portion of layer 760 will act as a base electrode for a Josephson Junction device. Note that layer 760 is in contact with the connector pad portion 752. This insures good electrical contact between the lead alloy layer 760 and external leads for the reasons given before on page 7. In FIG. 7e, a pattern of photoresist comprising photoresist pattern 762 is formed over a portion of layer 760. Photoresist portion 762 is formed over the ground plane portion 756 with a portion of region 758 and a portion of layer 760 positioned in between.

The exposed portion of layer 760 not protected by photoresist 762 is etched away completely to leave the base electrode 760', in FIG. 7f. During etching the photoresist 762 protects that portion of layer 760 which becomes base electrode 760'.

The junction and counter electrode are then formed over the base electrode 760' in the conventional manner which is summarized below. An insulating layer 764 (such as SiO) in FIG. 7g is deposited over the baseelectrode 760' and a junction region 766 is etched away. A junction 768 is formed in the junction region 766 and then a superconducting counter electrode 770 (made e.g. from lead alloy) is deposited in the junction region 766 to make contact with the junction 768.

Referring now to FIGS. 8a through 8g, the fabrication of an alternate multilayered superconducting circuit to that shown in FIGS. 7a through 7g is shown. The circuit of FIGS. 8a through 8g differs from that of FIGS. 7a through 7g in that the superconducting base electrode is made from niobium and not a lead alloy. Hence, there is no need for separate connector pad portions at the ground plane level of the circuit. Furthermore, the base electrode plane can also be planarized.

Figure 8A:
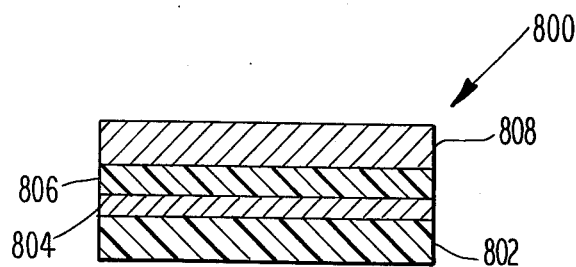
FIGS. 8(a) through 8(g) are a series of cross-sectional elevational means of a second alternate embodiment superconducting circuit of the present invention during various stages of fabrication.

In FIG. 8a, a structure designated generally 800 similar to that of FIG. 3c is used as a starting point. The structure comprises substrate level 802 made of SiO, electrically conducting contact layer 804 made of niobium, electrically insulating layer 806 formed by partially anodizing layer 804, and an electrically conducting object layer 808 made of niobium. In the preferred embodiment, layer 808 is 2000 Angstroms thick. The object layer 808 is first partially anodized in a manner described earlier to form an insulating anodized layer 809 shown in FIG. 8b. The remaining portion of conducting layer 808 from FIG. 8a is shown as layer 808' in FIG. 8b.

Figure 8B:
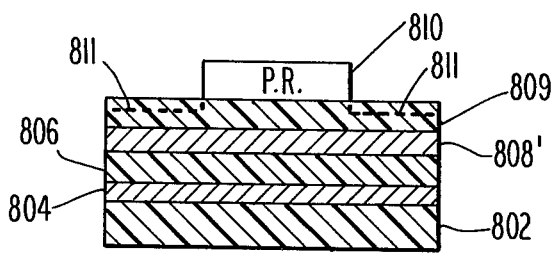

In FIG. 8b, a first pattern of photoresist comprising portion 810 is formed on the insulating layer 809. The remaining exposed surfaces of layer 809 is protected by the photoresist portion 810 is first etched to a thickness of layer 809 shown by the dotted lines 811 in FIG. 8b. Then the exposed surfaces are anodized completely through the layer 808' to the underlying insulating layer 806 to form the substantially planar, partially anodized and partially conducting layer designated generally 820 in FIG. 8c. Alternatively, the exposed surfaces of layer 809 could first be anodized and then etched to form a substantially planar surface.

Figure 8C:
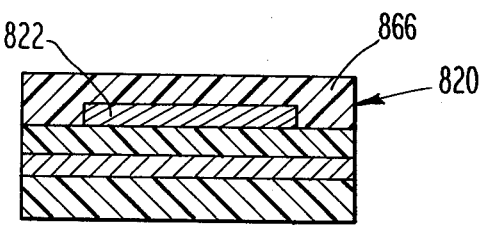

Layer 820 of FIG. 8c comprises an electrically conducting planar portion 822 called a ground plane. Insulating material in layer 806 and the insulating material formed by anodizing most of the object layer 808 from FIG. 8a surrounds the ground plane 822 in FIG. 8c. The photoresist portion 810 from FIG. 8b is removed by dipping the structure in acetone.

Figure 8D:
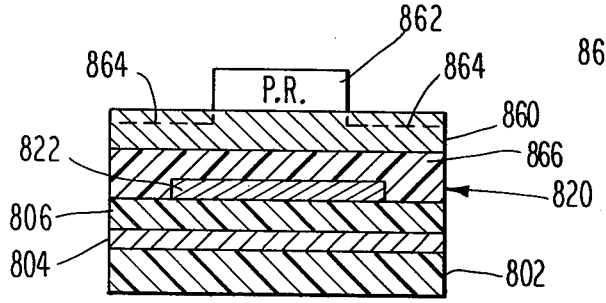

The composite layer 820 of FIG. 8c forms a substantially planar partially anodized and partially conducting layer on which an electrically conducting layer 860 made from niobium is deposited in FIG. 8d. Because the composite layer 820 is substantially planar, layer 860 is substantially planar. In FIG. 8d, a photoresist portion 862 is formed over a portion of layer 860. The photoresist portion 862 is positioned over the ground plane portion 822.

Figure 8E:
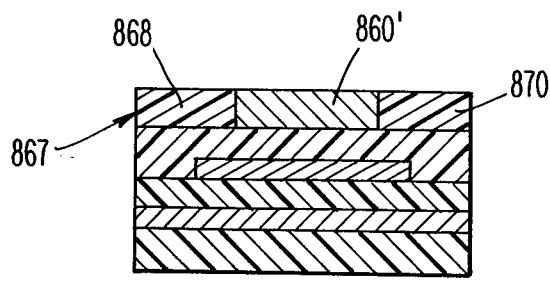

Before anodizing the exposed portion of layer 860 not protected by photoresist 862, a portion of layer 860 is etched away. See the dotted lines 864. During etching the photoresist 862 protects that portion of layer 860 which requires no etching. The exposed and etched portions of layer 860 are anodized with the contact layer 804 electrically connected as the anode. Exposed portions of layer 860 anodize completely through the thickness of layer 860 to contact a portion of the anodized region 866 of composite layer 820. The result is shown in FIG. 8e in the base electrode layer which includes the anodized regions 868 and 870 shown on either side of the base electrode 860'. Base electrode 860' is the portion remaining from layer 860 in FIG. 8d after anodization of layer 860 takes place. Note that the base electrode layer designated generally 867 is substantially planar with the top of the base electrode 860' at the same level as the top surfaces of anodized regions 868 and 870.

Figure 8F:
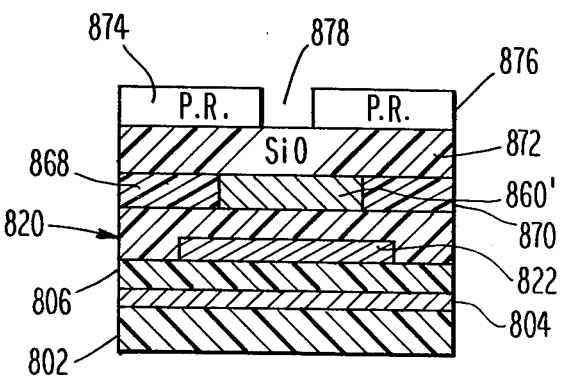
Figure 8G:
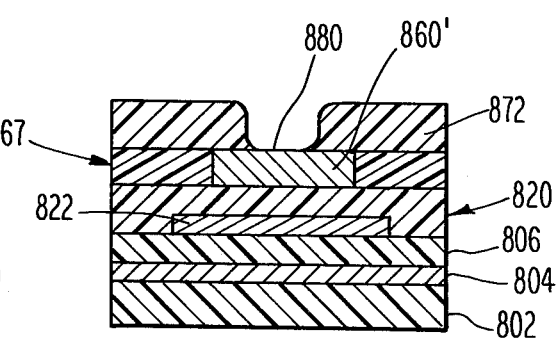

An insulating layer 872 in FIG. 8f is deposited on the composite base electrode layer 867 using techniques described earlier. Then a photoresist pattern comprising photoresist portions 874 and 876 are placed on top of the insulating layer 872. The pattern of photoresist comprising portions 874 and 876 are separated to form a space 878. The space 878 exposes a portion of the surface of layer 872. Layer 872 is etched away in this exposed portion through the entire thickness of layer 872 to expose a portion of the top surface of the base electrode 860'. This is called the junction region 880. The photoresists 874 and 876 is then washed away using acetone. A junction is then grown at the junction region 880 and a counter electrode deposited over the modified insulating layer 872' in FIG. 8g. The counter electrode will contact the junction in junction region 880 to form a Josephson Junction device. Note that the integrated structure of FIG. 8g is completely planar through the base electrode level 867. This eliminates forming multiple layers over steps in the integrated circuit which as we have seen before results in possible cracks and failures in the circuit.

While the present invention has been disclosed in connection with the preferred embodiment thereof, it should be understood that there may be other embodiments which fall within the spirit and scope of the invention as defined in the following claims.

We claim:

1. A method of anodizing at least a preselected portion of at least one electrically conducting layer disposed over a substrate comprising:
    forming an electrically conducting contact layer over said substrate;
    forming an electrically insulating layer over said contact layer;
    forming said at least one electrically conducting layer over said insulating layer;
    electrically coupling said contact layer to the positive terminal of an anodizing power source;
    anodizing said at least one conducting layer to a predetermined thickness.

2. The method of claim 1 wherein the step of anodizing comprises anodizing said at least one conducting layer through the entire thickness of said conducting layer.

3. The method of claim 2 wherein:
    the step of forming said contact layer comprises vacuum deposition of said contact layer on said substrate;
    the step of forming an electrical insulation layer comprises uniformly anodizing said contact layer to a predetermined thickness of said contact layer; and
    said conducting layer is vacuum deposited on said insulation layer.

4. The method of claim 1 wherein said method further comprises, after the step of forming said at least one electrically conducting layer, the step of forming a pattern of protective material on said at least one electrically conducting layer whereby only a preselected portion of said at least one electrically conducting layer not protected by said pattern of protective material is anodized during said anodizing step.

5. The method of claim 4 wherein said method further comprises the step of:
    reducing the thickness of said at least a preselected portion of said at least one conducting layer before the step of anodizing whereby a substantially planar partially anodized conducting layer is formed after anodization.

6. The method of claim 2, 3 or 4 wherein said method further comprises the step of:
    reducing the thickness of the anodized preselected portion of said at least one conducting layer after the step of anodizing whereby a substantially planar partially anodized conducting layer is formed.

7. The method of claim 5 wherein the step of reducing comprises the step of ion beam etching.

8. The method of claim 6 wherein the step of reducing comprises the step of ion beam etching.

9. The method of claim 1 or 2 wherein there are more than one electrically conducting layer formed over said substrate and said method further comprises anodizing at least a preselected portion of each of said conducting layers to be anodized.

10. The method of claim 1 wherein said contact layer and said at least one conducting layer comprises a material having superconducting properties.

11. The method of claim 9 wherein said material is niobium.

12. A method of obtaining a planar surface comprising:
    adding photoresist to a planar conductor whereby an area of said conductor is protected from action by further steps;
    etching part of the thickness of said conductor in unprotected areas to a predetermined thickness;
    anodizing said etched and unprotected areas of said conductor throughout the thickness thereof and until the thickness of the anodized areas substantially equal the thickness of the protected conducting areas; and removing said photoresist.

13. A method of obtaining a planar surface comprising:
    adding photoresist to a planar conductor whereby an area of said conductor is protected from the action of further steps;
    anodizing the unprotected area of said conductor throughout the entire thickness thereof;
    etching part of said anodized areas until the thickness of said anodized area substantially equals the area of the protected area of said conductor; and
    removing said photoresist.

* * * * *